US012229480B1

(12) United States Patent
Nawari

(10) Patent No.: US 12,229,480 B1
(45) Date of Patent: Feb. 18, 2025

(54) AI-ASSISTED CODE COMPLIANCE CHECKING FOR BUILDING AND LAND DEVELOPMENT

(71) Applicant: University of Florida Research Foundation, Inc., Gainesville, FL (US)

(72) Inventor: Nawari O. Nawari, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 18/429,741

(22) Filed: Feb. 1, 2024

(51) Int. Cl.
*G06F 30/27* (2020.01)

(52) U.S. Cl.
CPC .................. *G06F 30/27* (2020.01)

(58) Field of Classification Search
CPC ....................................................... G06F 30/27
See application file for complete search history.

(56) References Cited

U.S. PATENT DOCUMENTS

| | | | | |
|---|---|---|---|---|
| 4,964,060 | A * | 10/1990 | Hartsog | G06F 30/13 703/1 |
| 7,831,628 | B1 * | 11/2010 | Silva | G06Q 10/06 705/400 |
| 10,127,507 | B2 * | 11/2018 | Lavrov | G06Q 10/06313 |
| 10,754,999 | B1 * | 8/2020 | Vratimos | F24S 90/00 |
| 10,817,155 | B1 * | 10/2020 | Dubov | G06Q 50/163 |
| 11,263,361 | B1 * | 3/2022 | Soflin | H04L 67/1097 |
| 11,977,821 | B1 * | 5/2024 | Marsh | G06F 30/12 |
| 2005/0240426 | A1 * | 10/2005 | Smith | G06Q 50/188 705/16 |
| 2005/0240448 | A1 * | 10/2005 | Smith | G06Q 40/08 705/4 |
| 2006/0031041 | A1 * | 2/2006 | Afshar | G06Q 50/04 702/184 |

(Continued)

OTHER PUBLICATIONS

P. Ivson, A. Moreira, F. Queiroz, W. Santos and W. Celes, "A Systematic Review of Visualization in Building Information Modeling," in IEEE Transactions on Visualization and Computer Graphics, vol. 26, No. 10, pp. 3109-3127, Oct. 1, 2020, doi: 10.1109/TVCG.2019.2907583. (Year: 2020).*

*Primary Examiner* — Charles L Beard
(74) *Attorney, Agent, or Firm* — Thomas | Horstemeyer, LLP

(57) ABSTRACT

The present disclosure presents systems, methods, and non-transitory computer-readable media for transforming civil, architectural, or engineering drawings into Building Information Modeling (BIM) or Computer-Aided Design (CAD) models. One such method comprises training an artificial intelligence algorithm on a collection of 2D civil and architectural blueprint designs to enable the artificial intelligence algorithm to efficiently extract elements from the blueprint designs and map them into 3D data model objects; creating a 3D data model using the trained artificial intelligence algorithm, from an input collection of 2D blueprint designs; creating a project database by adding metadata from the input collection of 2D blueprint designs; generating a database of code rules and regulations; performing, using the project database, and the database of code rules and regulations, a compliance check to determine if the 3D data model complies with the database of code rules and regulations; and presenting results of the compliance check.

20 Claims, 13 Drawing Sheets

(56) References Cited

U.S. PATENT DOCUMENTS

| | | | |
|---|---|---|---|
| 2007/0061162 A1* | 3/2007 | Smith | G06Q 30/0633 705/80 |
| 2007/0214073 A1* | 9/2007 | Smith | G06Q 40/06 705/36 R |
| 2008/0033847 A1* | 2/2008 | McIntosh | G06Q 10/087 705/28 |
| 2008/0208763 A1* | 8/2008 | Smith | G06Q 50/188 705/80 |
| 2011/0061011 A1* | 3/2011 | Hoguet | G06Q 30/0603 715/769 |
| 2013/0218780 A1* | 8/2013 | Buzz | G06Q 10/06 705/301 |
| 2014/0278280 A1* | 9/2014 | Pardo-Fernandez | G06F 30/13 703/1 |
| 2016/0086242 A1* | 3/2016 | Schafer | G06F 30/17 705/26.4 |
| 2016/0110824 A1* | 4/2016 | Zabala Rodriguez | G06Q 50/26 705/315 |
| 2017/0147717 A1* | 5/2017 | Chen | G06F 30/13 |
| 2019/0235733 A1* | 8/2019 | Stubler | G06F 3/03542 |
| 2019/0236844 A1* | 8/2019 | Balasian | G06F 3/0304 |
| 2019/0354640 A1* | 11/2019 | Huebner | G06F 30/13 |
| 2020/0104522 A1* | 4/2020 | Collart | G06T 19/20 |
| 2020/0133970 A1* | 4/2020 | Khabiri | G06N 3/045 |
| 2020/0242849 A1* | 7/2020 | Cini | G06T 17/00 |
| 2020/0258174 A1* | 8/2020 | Rodriguez | G06Q 50/163 |
| 2020/0301432 A1* | 9/2020 | Bose | G06Q 10/087 |
| 2020/0387643 A1* | 12/2020 | Lee | G06F 30/12 |
| 2020/0387788 A1* | 12/2020 | Alves | G06V 10/82 |
| 2020/0388001 A1* | 12/2020 | Lee | G06F 30/13 |
| 2021/0073449 A1* | 3/2021 | Segev | G06F 30/27 |
| 2021/0082079 A1* | 3/2021 | Shrivastava | G06Q 90/205 |
| 2021/0103726 A1* | 4/2021 | Lin | G06F 30/13 |
| 2021/0110078 A1* | 4/2021 | Jalla | G06F 30/13 |
| 2021/0303747 A1* | 9/2021 | Jalla | G06F 30/13 |
| 2021/0365602 A1* | 11/2021 | Gifford | G06T 17/00 |
| 2021/0397760 A1* | 12/2021 | Whitney, Jr. | G06N 20/00 |
| 2022/0092227 A1* | 3/2022 | Yin | G06F 18/2323 |
| 2022/0108043 A1* | 4/2022 | Yang | G06T 3/153 |
| 2022/0188488 A1* | 6/2022 | Patrick | G06F 30/13 |
| 2022/0245743 A1* | 8/2022 | Srinivasan | G06F 30/13 |
| 2022/0292230 A1* | 9/2022 | Murphy | G06F 30/27 |
| 2022/0292240 A1* | 9/2022 | Murphy | G06F 30/27 |
| 2022/0391627 A1* | 12/2022 | Powles | G06Q 10/103 |
| 2023/0052254 A1* | 2/2023 | Benson | G06F 30/12 |
| 2023/0195971 A1* | 6/2023 | Carrington | G06F 30/12 703/1 |
| 2023/0196486 A1* | 6/2023 | Srinivasan | G06Q 30/018 705/315 |
| 2023/0221120 A1* | 7/2023 | Bina | G01C 21/165 702/150 |
| 2023/0244827 A1* | 8/2023 | Chandragiri | G06F 30/27 703/1 |
| 2023/0267240 A1* | 8/2023 | Lau | G01S 17/89 703/1 |
| 2023/0289498 A1* | 9/2023 | Roy | G06T 3/00 |
| 2023/0334187 A1* | 10/2023 | Khan | G06F 30/27 |
| 2023/0359790 A1* | 11/2023 | Lee | G06F 30/27 |
| 2023/0394605 A1* | 12/2023 | Man | G06N 5/02 |
| 2023/0401660 A1* | 12/2023 | Ambrosch | G06Q 50/16 |
| 2024/0020929 A1* | 1/2024 | Tyrrell | G06F 30/12 |
| 2024/0038083 A1* | 2/2024 | Li | G16H 40/20 |
| 2024/0053816 A1* | 2/2024 | Fields | G06T 19/006 |
| 2024/0054576 A1* | 2/2024 | Henry | G06V 30/422 |
| 2024/0086858 A1* | 3/2024 | Cowdroy | G06Q 10/10 |
| 2024/0111914 A1* | 4/2024 | Fink | G06F 30/27 |
| 2024/0111928 A1* | 4/2024 | Fink | G06F 30/13 |
| 2024/0111929 A1* | 4/2024 | Fink | G06F 30/27 |
| 2024/0112420 A1* | 4/2024 | Fink | G06F 30/18 |
| 2024/0119201 A1* | 4/2024 | Foley | G06F 30/13 |
| 2024/0169193 A1* | 5/2024 | Bews | G06F 30/13 |
| 2024/0183177 A1* | 6/2024 | Telleria | B05B 13/0431 |
| 2024/0202379 A1* | 6/2024 | Nawari | G06F 30/27 |

* cited by examiner

| Domain | Element | Image | Data | Attributes | Relationship | IFC Object | Metadata |
|---|---|---|---|---|---|---|---|
| Structure | Column | | Height<br>Width<br>Depth | Section<br>Structural Plan<br>Structural Plan | Walls, Beams, Slabs | IfcColumn | Textual and graphical data are in sections details. |
| Architecture | Wall | | Height<br>Width<br>Depth | Building Section<br>Architecture Plan<br>Architecture Plan | Columns, Beams, Walls | IfcWall | Textual and graphical data are in sections details. |
| Architecture | Door | | Height<br>Width<br>Depth | Building Section<br>Architecture Plan<br>Architecture Plan | Wall | IfcDoor | Textual and graphical data are in sections details. |
| Structure | Beam | B1: 12x24 | Length<br>Width<br>Depth | Structural Plan<br>Structural Plan<br>Structural Plan | Columns, Slab, Walls | IfcBeam | Textual and graphical data are in sections details. |
| Structure | Stair | | Tread<br>Depth<br>Riser<br>Height | Architectural Plan<br>Building Section<br>Building Section | Slabs, Beams, Columns, Walls | IfcStair | Textual and graphical data are in sections details. |
| Land Development | Parcel | | Lot Size<br>Lot Width<br>Lot Depth<br>Coverage | Site Plan<br>Site Plan<br>Site Plan<br>Site Plan | Road, Building, Wetland | IfcParcel | Textual and graphical data are in other plans |
| Land Development | Side Walk | | Width<br>Length | Site Plan<br>Site Plan | Road, Parcel Building, Wetland | IfcSideWalk | |
| Land Development | Wetland | | Acreage<br>Dist. To Bldg. | Site Plan<br>Site Plan | Road, Parcel, Building, | IfcWetland | |

FIG. 7

ND LAND DEVELOPMENT

AI-ASSISTED CODE COMPLIANCE CHECKING FOR BUILDING AND LAND DEVELOPMENT

STATEMENT REGARDING NON-FEDERALLY SPONSORED FUNDING

This invention was made whole or in part from funding received under contract AGR00021762 received from VIRTUAL REVIEW ASSIST.

BACKGROUND

Building construction codes institute various requirements to be met by new construction projects. Thus, building codes often specify requirements to be met by building or infrastructure projects. Thus, to determine whether a project or design is compliant with these requirements, project parameters are needed to be obtained, calculated, and/or evaluated, such as, but not limited to, the type of construction, the insulation values, the size and type of windows, their location and orientation, etc. Accordingly, the skill and know-how required to obtain the appropriate design parameters can involve much effort, costs, and time in order to comply with the applicable government codes and laws.

BRIEF DESCRIPTION OF THE DRAWINGS

The details of the present disclosure, both as to its structure and operation, may be gleaned in part by study of the accompanying drawings, in which like reference numerals refer to like parts.

FIG. 7 depicts a data structure comprising a table relationship of image elements that can be mapped to model elements and can be used in transforming the underlying construction or landscape development drawing document to a 3D data model in accordance with various embodiments of the present disclosure.

DETAILED DESCRIPTION

Figure 1:
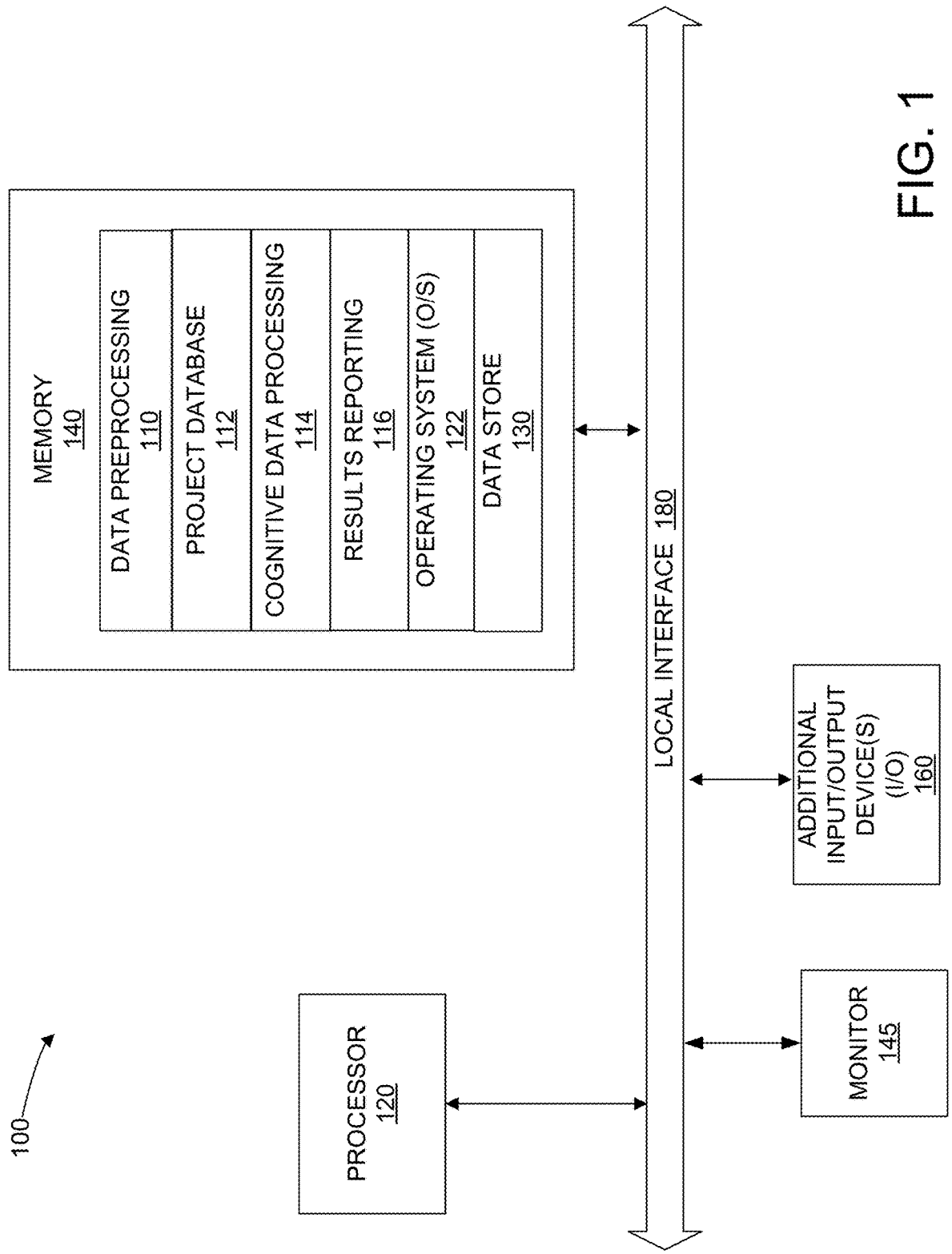
FIG. 1 displays a block diagram of an AI-Driven Code Compliance Checking (AI-CCC) system in accordance with the present disclosure.

In an embodiment, systems, methods, and non-transitory computer-readable media are disclosed for transforming civil, architectural, and engineering drawings into Building Information Modeling (BIM) or Computer-Aided Design (CAD) models. Once the BIM or CAD models along with associated metadata are formed, cognitive data processing techniques are employed, such as generative Artificial Intelligence (AI) tools that generate necessary code rules and regulations to ensure that models conform with compliance standards.

This application is applicable to all embodiments of International Residential Code (IRC) and International Building Code (IBC), Land Development Code and their variations as applicable to all U.S. States and Regions. In the examples presented herein, codes are related to building/infrastructure code involving the Florida Building Code Residential (FBCR) code. However, exemplary methods and systems of the present disclosure are applicable to non-building codes in general and International Residential Code (IRC) and International Building Code (IBC), Land Development Codes and their variations as applicable to all U.S. States and Regions, and worldwide.

Many have reported the benefits of Building Information Models (BIM) in the AEC (Architecture, Engineering & Construction) industry and have indicated that BIM has improved collaboration, cost-savings, project time schedules, have enhanced communications and data exchanges between different domains, and also have aided in the whole life cycle of a building. A BIM model contains information about all the different components represented in the design model, such as materials and equipment. For example, clicking on a window in a BIM may display all of the information about that window's brand, material, dimensions, efficiency rating, glass options, finish options, life cycle, etc.

Thus, in accordance with the present disclosure, a cutting-edge method for code compliance verification using a combination of Artificial Intelligence (AI) and Rule-Based algorithms is introduced. Leveraging Machine Learning platforms like Fast R-CNN and Mask R-CNN, this approach transforms civil, architectural, and engineering PDF drawings into Building Information Modeling (BIM) or CAD models.

In accordance with various embodiments, an exemplary framework for code compliance verification includes a data preprocessing stage/module, a project database stage/module, a cognitive data processing stage/module, and results reporting stage/module. The preprocessing stage includes training the AI algorithms on a vast collection of civil and architectural blueprints to enable the developed algorithm to efficiently extract elements from these designs and map them into BIM or CAD objects. The next stage is focused on creating a detailed project database by adding metadata from the blueprints such as the general notes, product specifications, rezoning approval documents, etc. Once the BIM or CAD models along with the associated meta data are formed, cognitive data processing techniques are employed such as generative AI tools that craft the necessary code rules and regulations and communicates with the project database and a compliance checking engine to perform and ensure that models conform with compliance standards. Then, results of the compliance checking can be presented in the next stage.

After reading this description, it will become apparent to one skilled in the art how to implement the various alternative embodiments and alternative applications described herein. However, although various embodiments are described herein, it is understood that these embodiments are presented by way of example and illustration only, and not limitation. As such, this detailed description of various embodiments should not be construed to limit the scope or breadth of the appended claims.

FIG. 1 displays a block diagram of an AI-Driven Code Compliance Checking (AI-CCC) system 100 in accordance with the present disclosure. The system 100 includes at least one processor 120, memory 140, a visual output device such as computer monitor 145, and one or more additional input and/or output (I/O) devices 160 (or peripherals) that are communicatively coupled via a local interface 180. These peripherals may be coupled to the processor 120 by electronic interfaces including input/output I/O ports, direct memory access (DMA) circuitry, registers, etc., which have not been included in the block diagram of FIG. 1 because such interfaces are well known to those skilled in the art.

According to an exemplary embodiment, the processor 120 is a hardware device for executing software, particularly that stored in memory 140. The processor 120 can be any custom made or commercially available processor, a central processing unit (CPU), an auxiliary processor among several processors associated with the display device 100, a semiconductor based microprocessor (in the form of a microchip or chip set), a macroprocessor, or generally any device for executing software instructions. The memory 140 provides storage of instructions and data for programs executing on processor 120, such as one or more of the functions and/or modules disclosed herein, including a data preprocessing module/stage 110, a project database module/stage 112, a cognitive data processing module/stage 114, and results reporting module/stage 116. Also stored in the memory 140 may be a data store 130 and other data, which stores information relevant to the AI-CCC system, such as BIM/CAD models, input information, building code sections, manufacturer data, neural network models, AI or machine learning algorithms, etc. The data store 130 can be located in a single installation or can be distributed among many different geographical or network locations.

The user may interact with the system 100 utilizing one or more user devices. A user device may comprise any device capable of communicating over a network and/or communicating content. For example, a user device may take the form of a computer or processor, or a set of computers/processors, such as a computer, laptop, notebook, hand held computer, personal digital assistant, cellular phone, smart phone (e.g., iPhone®, BlackBerry®, Android®, etc.), tablet, wearable (e.g., smart watch and smart glasses), automotive infotainment system, or any other suitable device having user interaction capabilities or dialog capabilities. The user device may be in electronic communication with the system 100 via a computer or communication network.

Processor(s) 120 may comprise a central processing unit (CPU). Additional processors may be provided, such as a graphics processing unit (GPU), an auxiliary processor to manage input/output, an auxiliary processor to perform floating-point mathematical operations, a special-purpose microprocessor having an architecture suitable for fast execution of signal-processing algorithms (e.g., digital-signal processor), a slave processor subordinate to the main processing system (e.g., back-end processor), an additional microprocessor or controller for dual or multiple processor systems, and/or a coprocessor. Such auxiliary processors may be discrete processors or may be integrated with processor 120. Examples of processors which may be used include, without limitation, the Pentium® processor, Core i7® processor, and Xeon® processor, all of which are available from Intel Corporation of Santa Clara, California.

The local interface or bus 180 can be, for example but not limited to, one or more buses or other wired or wireless connections, as those skilled in the art will appreciate. The local interface 180 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

Figure 2:
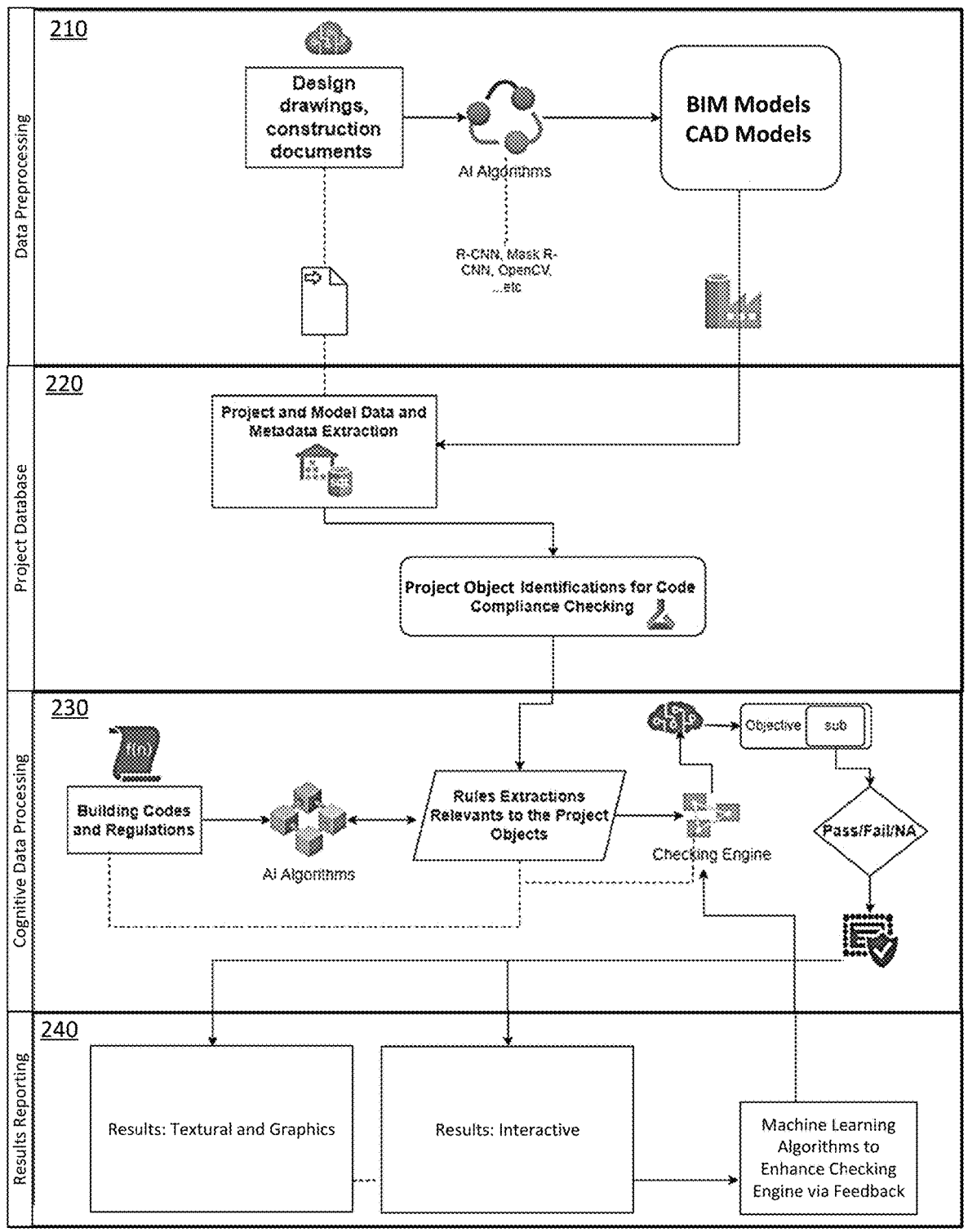
FIG. 2 depicts an overview of an exemplary AI-CCC process in accordance with various embodiments of the present disclosure.

FIG. 2 depicts an overview of the disclosed (AI-CCC) framework, with an AI-CCC processing starting with a data preprocessing stage 210 that is followed by a project database stage 220, a cognitive data processing stage 230, and a results reporting stage 240. In the data preprocessing stage 210, a blueprint collection of scanned 2D and 3D drawings including full set of construction documents are organized into training, validation, and testing groups for AI modules. The data set is comprised of floor plans, sections, elevations, site plans, civil site plans, land use plans, MEP plans, details, general notes, drainage, storm water, utilities plans, road plans and sections. This phase includes labeling those images for the AI training, validation, and testing. The AI algorithms employed in this phase can include: Mask R-CNN framework, Fully Convolutional Network (FCN), and Region of Interest Align (RoIAlign) using the Feature Pyramid Network (FPN). Construction documents are grouped into architectural drawings, structural drawings, MEP drawings, site plans, master site plane, utilities drawings, landscape drawings, stormwater drawings, road design drawings, and photometric drawings.

Figure 3:
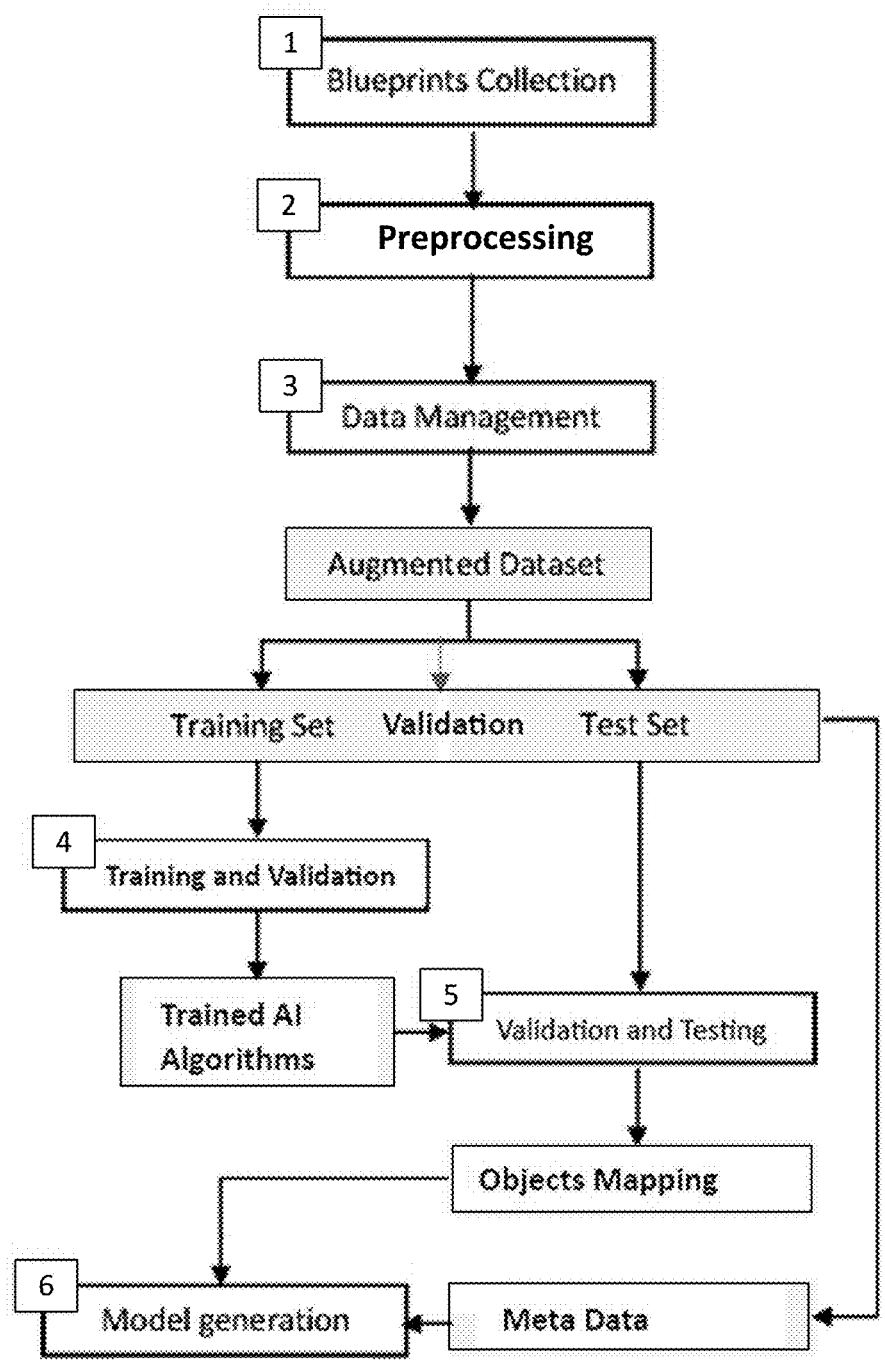
FIG. 3 shows fundamental instruments for the data preprocessing stage of FIG. 2.
Figure 4:
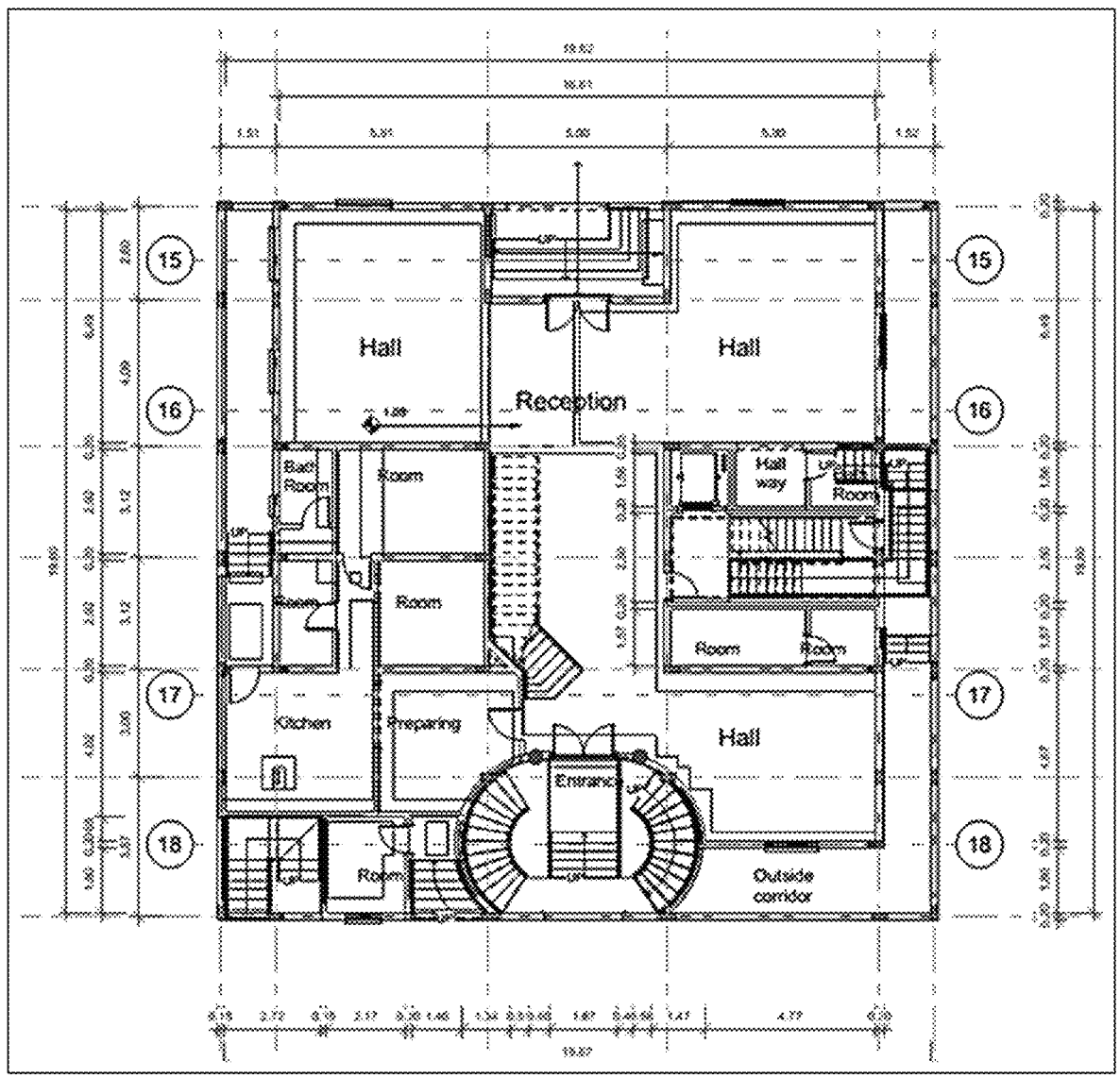
FIG. 4 shows an example of an architectural plan in accordance with the present disclosure.
Figure 5:
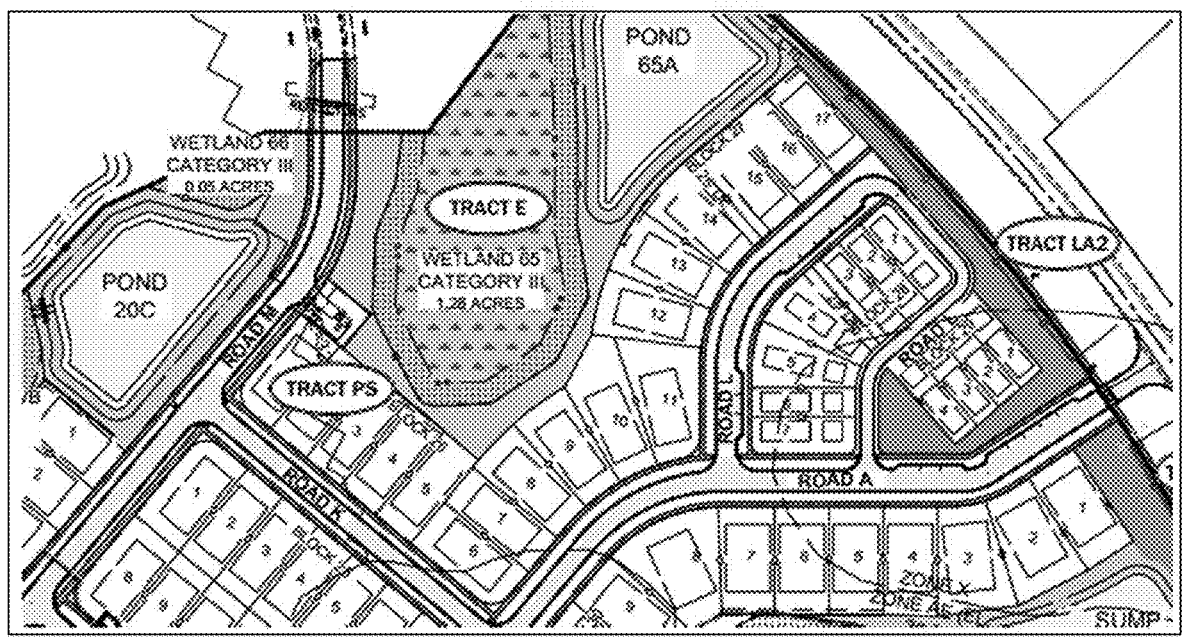
FIG. 5 shows an example of a land development site plan in accordance with the present disclosure.

FIG. 3 summarizes fundamental instruments for the data preprocessing stage 210. Here the stage includes a blueprints collection step (1), a preprocessing step (2), a data management step (3), a training and validation step (4), validation and testing step (5), and a model generation step (6). Correspondingly, the blueprints collection step (1) involves acquiring or inputting scanned or PDF drawing files of construction documents and land development designs. For illustration purposes, FIG. 4 showing an example of an architectural plan; and FIG. 5 shows an example of a land development site plan. Correspondingly, the architectural plan or the land development site plan may be acquired during the blueprints collection step The preprocessing step (2) involves analyzing the acquired drawings (e.g., building and land development design drawing sets) and creating images of site plan, floor plan, road sections, utilities plan, etc., from the acquired drawings. Further, as part of the data management step (3), features of the created images are labeled and label areas are clipped as new images and training data is assembled, such as by data augmentation, to provide/sort data sets for training, validation, and/or testing. Thus, during the training and validation step (4) and the validation and testing step (5), AI algorithms are trained via hyperparameter configuration, weight adjustment based on loss function, and evaluation using several metrics, using the applicable data sets, to develop trained AI algorithms. As part of the validation and testing step (5), a test dataset can be analyzed to identify text from the drawing files (e.g., via optical code recognition (OCR) software) and stored as metadata with coordinate information linking the stored metadata with classified object(s) in close proximity.

Figure 6:
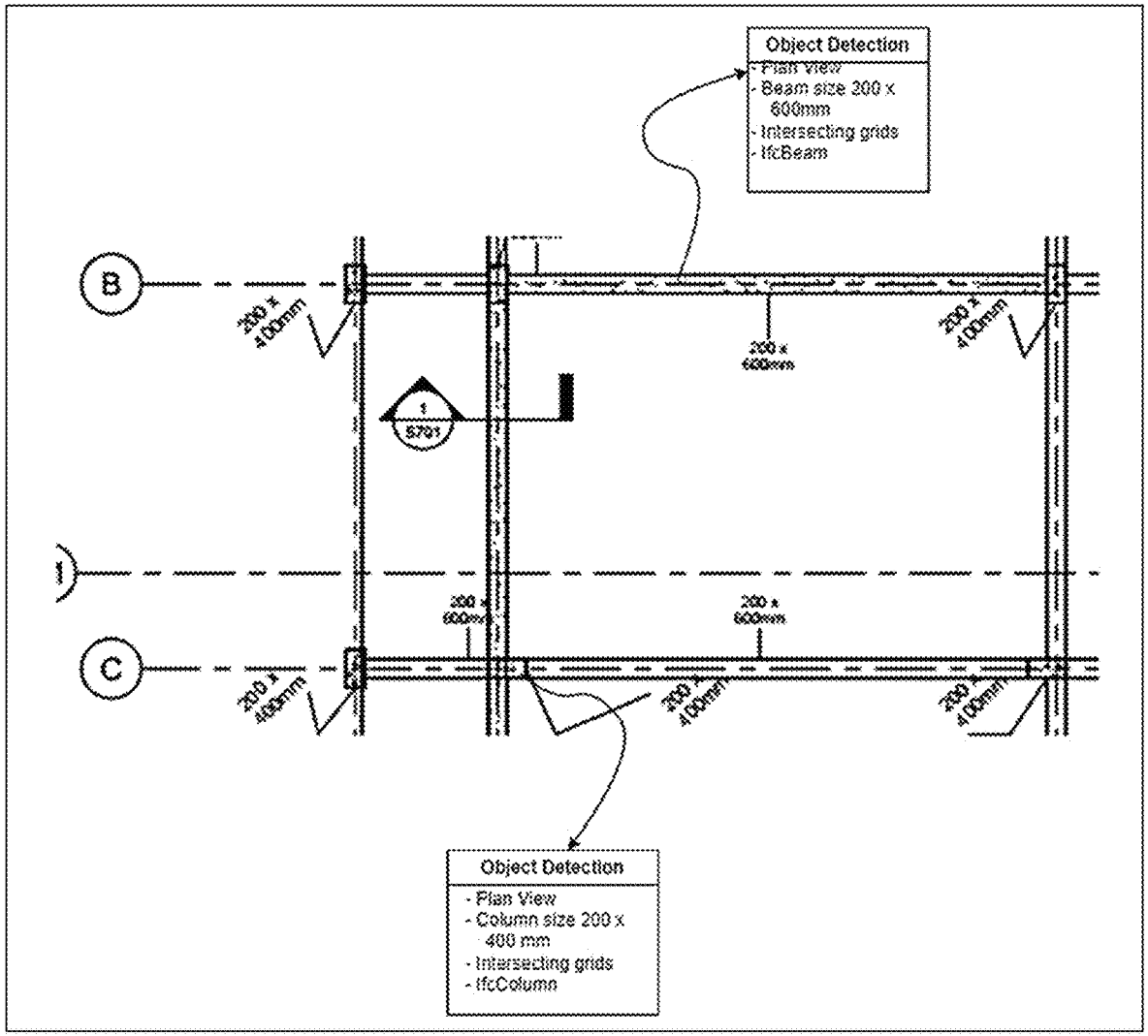
FIG. 6 shows structural elements of a drawing document that can be identified by a trained AI algorithm and mapped to model objects in accordance with various embodiments of the present disclosure.
Figure 8:
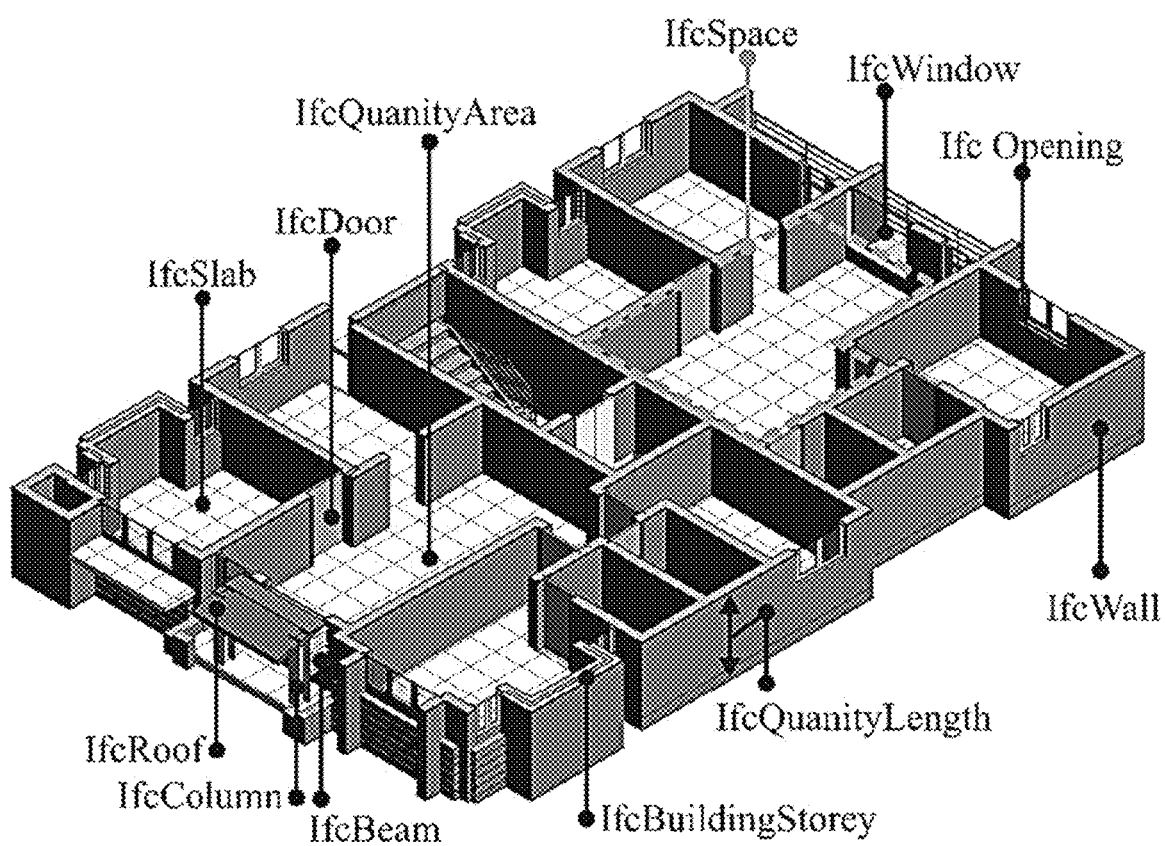
FIG. 8 shows example building objects for a Building Information Modeling (BIM) or Computer-Aided Design (CAD) model using the Industry Foundation Classes (IFC) schema in accordance with the present disclosure.

For model generation step (6), features classified by the AI algorithms from the acquired drawings of construction/land development documents are transformed to a BIM or CAD model by mapping features (e.g., clipped images) of the drawing files that are extracted by AI algorithm(s) and mapping them to model objects that are also linked with stored metadata by proximity with the corresponding object feature in the drawing file. For illustration purposes, FIG. 6 shows structural elements of a drawing document that can be identified by a trained AI algorithm and mapped to model objects, and FIG. 7 provides a data structure comprising a table relationship of image elements that can be mapped to model elements, along with associated domain, data, attributes, relationships, IFC object schema description, and extracted metadata that can be used in transforming the underlying construction or landscape development drawing document (e.g., 2D representation) to a 3D data model (e.g., BIM or CAD) of the subject matter represented in the underlying drawing. For example, FIG. 8 shows example building objects for a BIM or CAD model using the Industry Foundation Classes (IFC) schema. Accordingly, a BIM or CAD model can be generated and output at conclusion of the model generation step. After testing validating the results the AI algorithms, models are prepared for code compliance checking.

For the project database stage 220, a project database includes the model data created in the previous phase plus any other metadata such as approval documents for re-zoning, new approval products documents, general notes and description, Master Planned Unit Development "MPUD", and Conditional Use Permit (CUP).

In the cognitive data processing stage 230, AI algorithms are trained to extract rules from the building and land development codes and regulations for each relevant object in the project database. These rules are then examined by the compliance checking engine to determine the nature of the rules, such as objective, subjective, and dependent. Objective rules are examined directly since the constraints are given. Dependent rules mean that they rely on other rules to be fulfilled before they can be examined. Thus, dependent rules can be objective or subjective. In case of subjective rules, fuzzy logic and predicates, neural network, and fuzzy neural networks will be utilized to transform concept into a computable rule representation. Using neural networks and fuzzy neural networks, such as Adaptive Fuzzy Neural Network (AFNN), Fuzzy ARTMAP, A type of fuzzy neural network that uses adaptive resonance theory (ART) and fuzzy logic to perform classification tasks, Fuzzy Min-Max Neural Network (FMMNN), Fuzzy Inference Neural Network (FINN), Fuzzy Associative Memory (FAM), and Fuzzy C-Means Neural Network (FCMNN).

Figure 9:
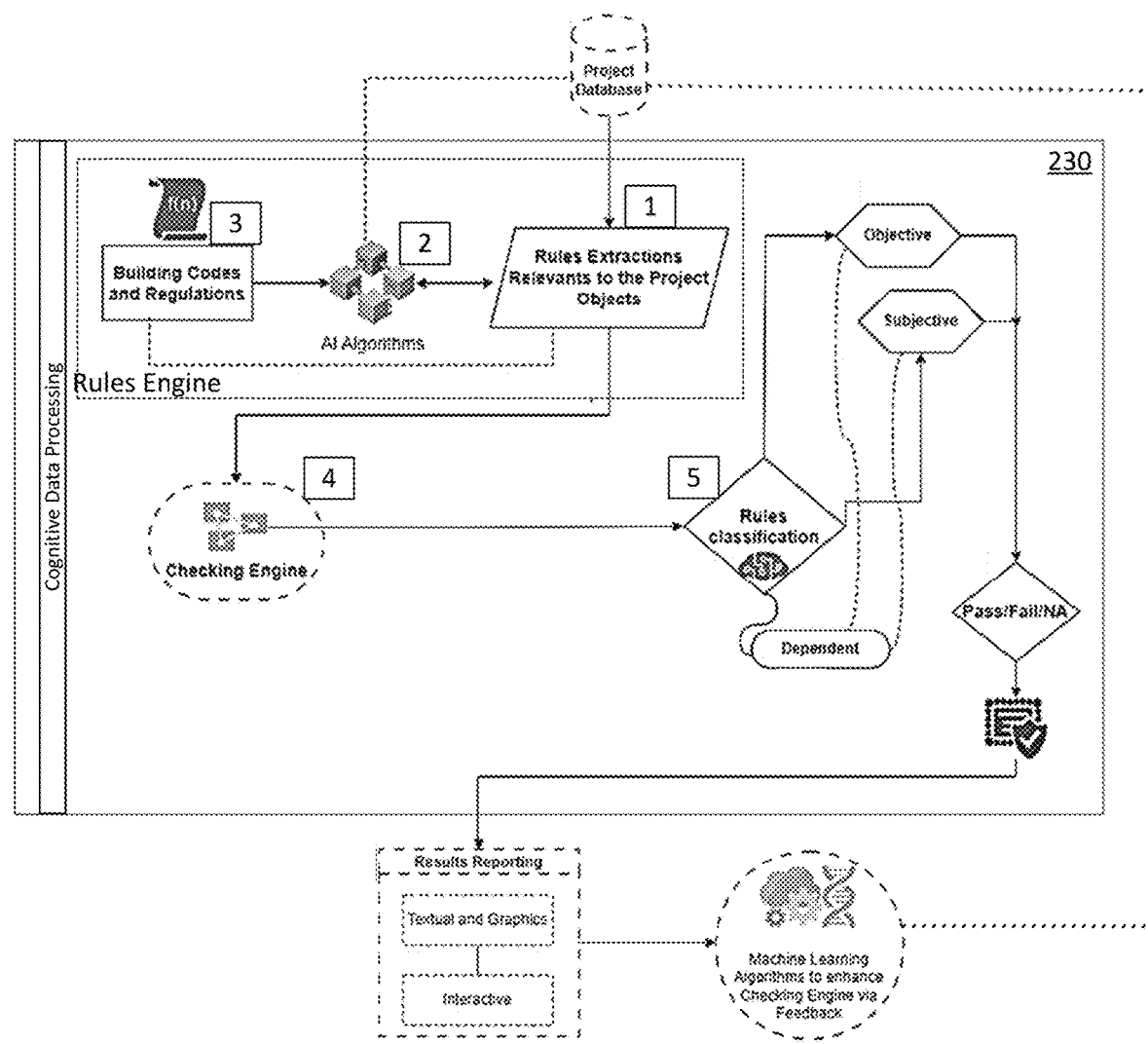
FIG. 9 depicts the fundamental instruments for the cognitive data processing stage of FIG. 2 in accordance with various embodiments of the present disclosure.

FIG. 9 summarizes the fundamental instruments for the cognitive data processing stage 230. Here the stage includes a rules extractions step (1), AI algorithms (2), codes and regulations step (3), a compliance checking engine (4), and a rules classifications step (5). Correspondingly, the rules extraction step (1) involves acquiring or obtaining data model objects from the project database, such as those consistent with the IFC data object schema, Autodesk Revit project database object schema, Autodesk Autocad project database object schema, ifcXML project object schema, and/or MXL project data object schema, and using pre-trained large language models (PLLMs) and large language models (LLMs), generating artificial intelligence (AI) algorithms to extract relevant rules for the specific building element(s), and organizing rules using building element relationships. Accordingly, the AI algorithms can be deployed on various neural network models, including mask R-CNN framework, fully convolution network (FCN), region of interest align (RoIAlign) using the feature pyramid network (FPN), among others.

The AI algorithms (2) can also accept as input various building codes and regulations (e.g., building codes, municipal codes, public work codes, ADA and life safety codes, etc.).

The Rule Engine (RE) stands as a crucial element in the cognitive data processing framework, bolstering the functionality of the compliance checking engine. Its development is based on components 1, 2, and 3, as depicted in FIG. 9. User interface elements of the RE application are outlined in FIGS. 10A-10D.

Figure 10A:
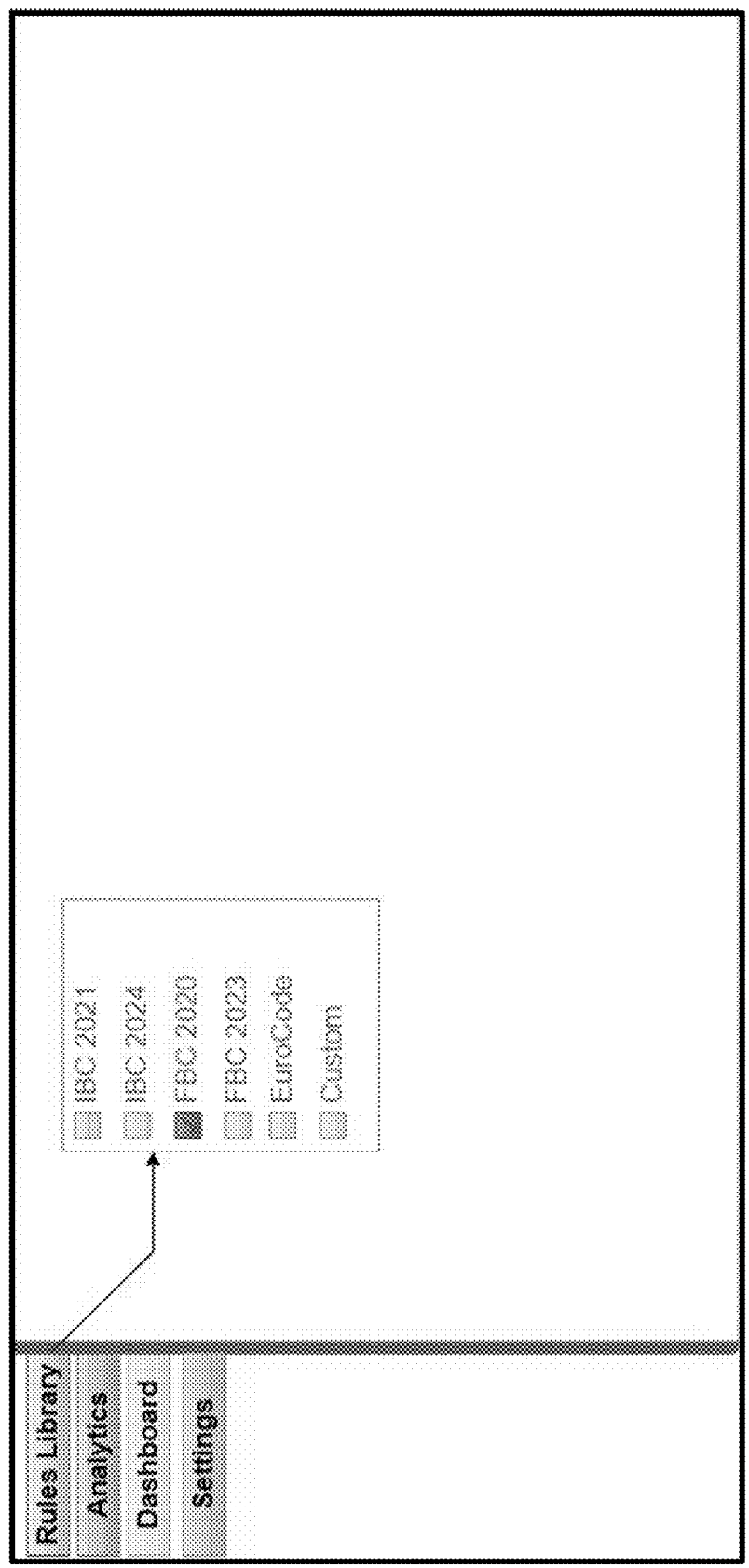
FIGS. 10A-10D show user interface elements of an exemplary rules engine (RE) in accordance with various embodiments of the present disclosure.
Figure 10B:
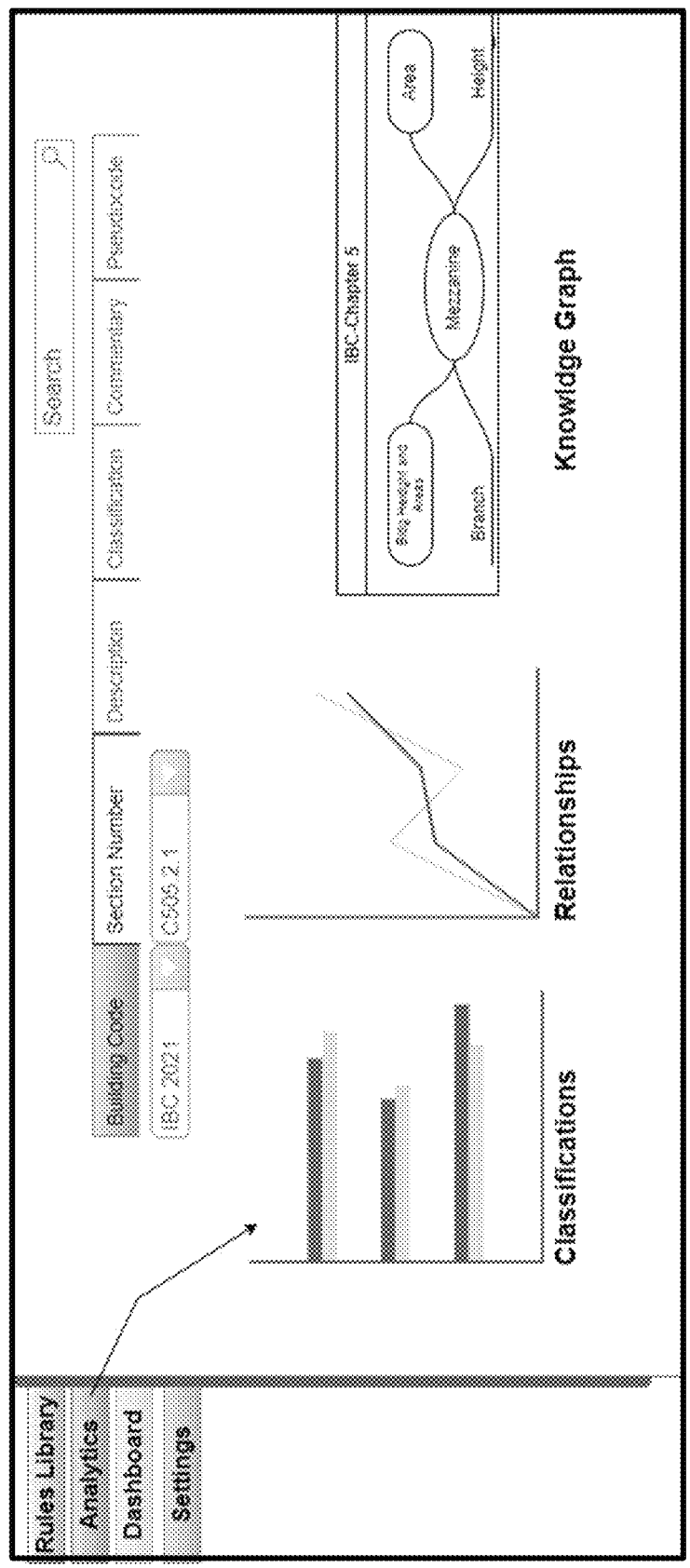

In various embodiments, the rule engine application constitutes a component of the cognitive processing stage. In various embodiments, an exemplary rule engine application can be configured using an online or network interface, such as that provided via website interface. For example, as shown in FIG. 10A, on a left side of the website, there may be a main navigation menu with four items: a) Settings for configuring application settings; a Rules Library where users can access and manage different rules, as illustrated in FIG. 10A; Analytics to view Knowledge graph and data analysis and reports related to the rules, as illustrated in FIG. 10B; and a Dashboard: a central hub for the application's main features, as illustrated in FIG. 10C.

Figure 10C:
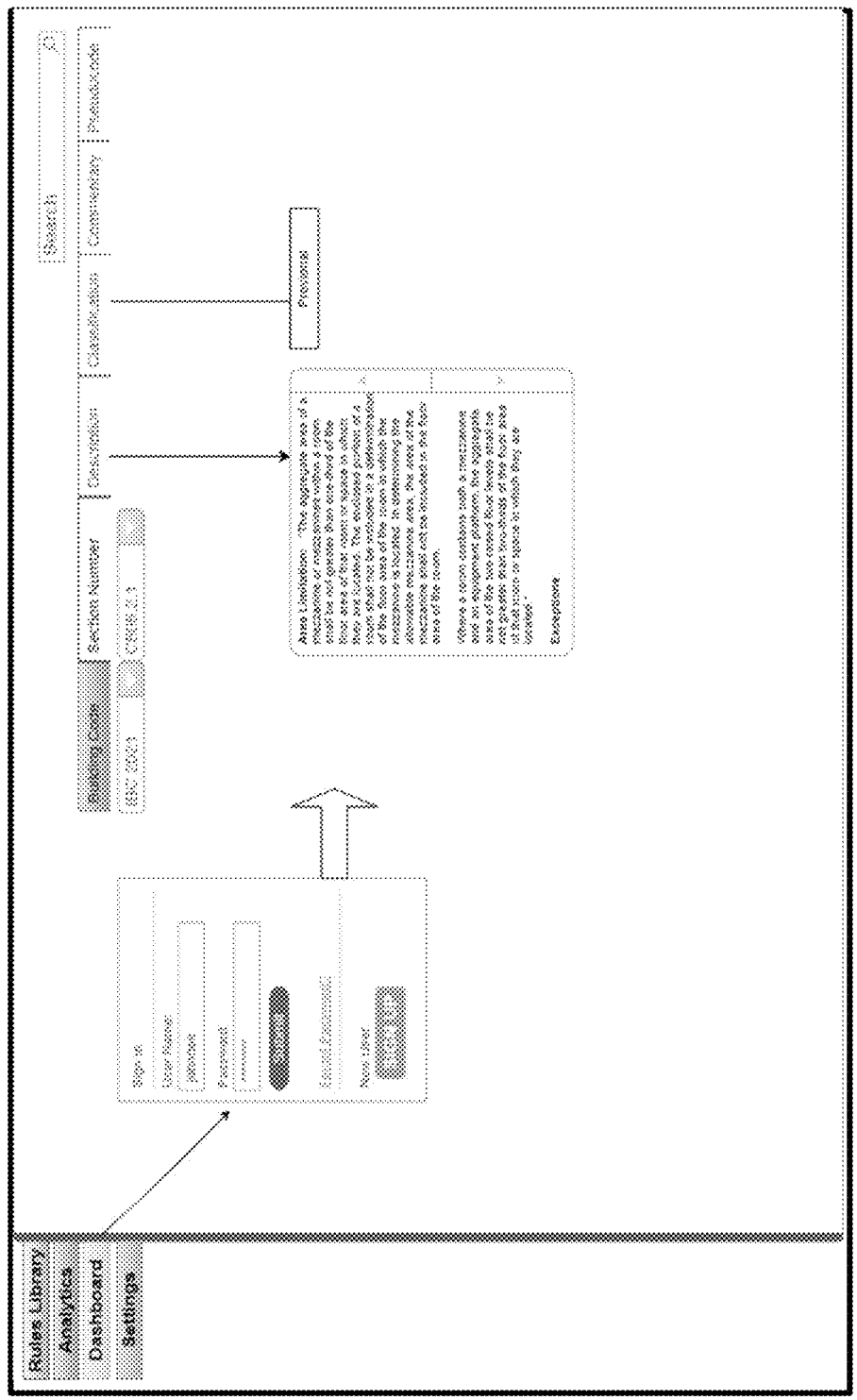
Figure 10D:
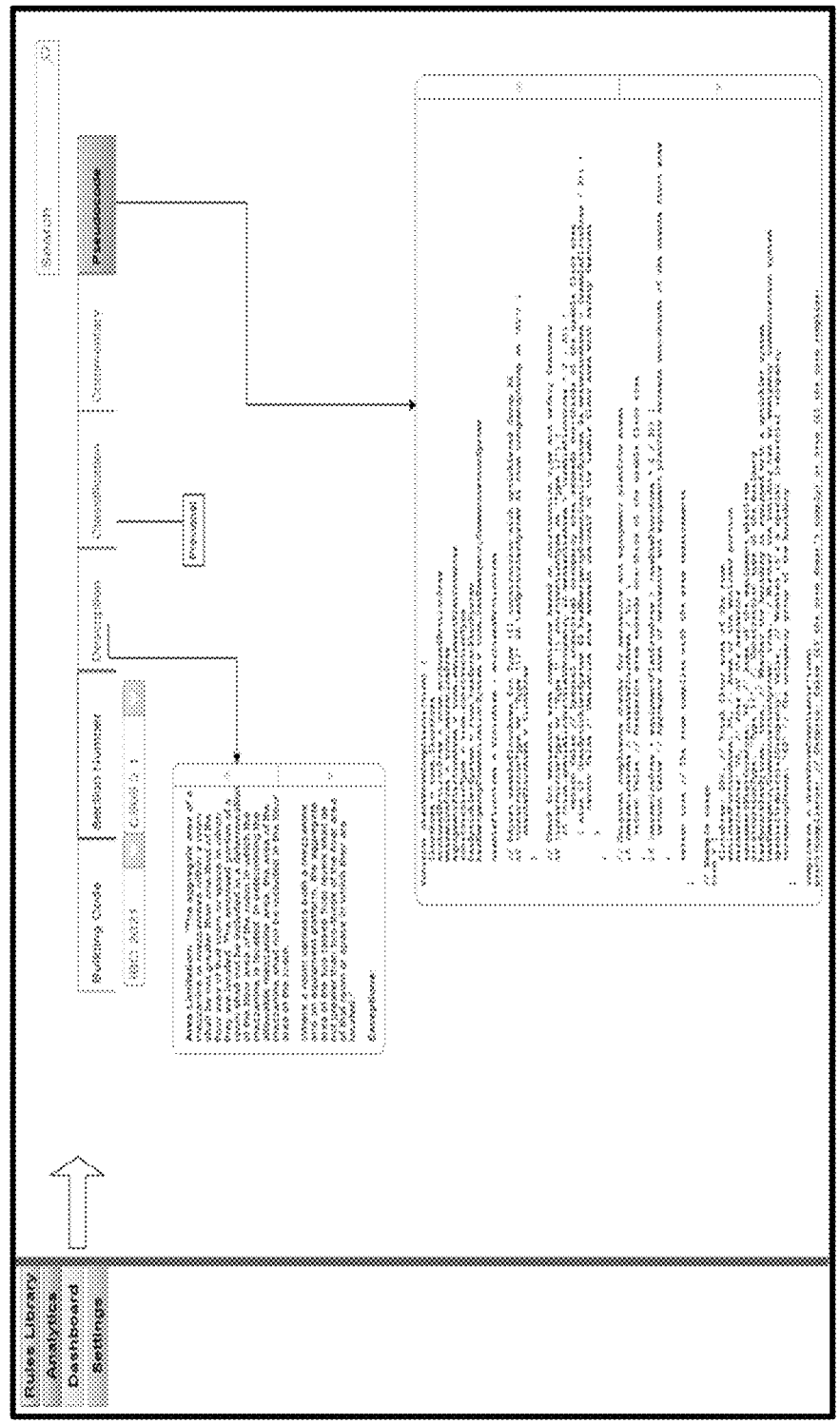

Inside the Dashboard, as illustrated in FIG. 10C, there may be several sub-menu items: a Building Code or Land Development Code section for entering or viewing building codes; a Section Number section where users can select or find specific sections of the code; a Description section: A field for detailed descriptions of the rules or codes; a Classification section for categorizing or viewing the classification of different rules; a Commentary section that focuses on providing the full meaning and implications of the building code and gives the most effective method of application, and the consequences of not adhering to the code; and a Pseudocode section: An interactive area for users to create or edit pseudocode related to the rules, as illustrated in FIG. 10D.

In an non-limiting example, the BIM model defines objects as parameters and relations to other objects and carrying object attributes that specify pertinent details about the objects. For example, the BIM model can include spatial relationships of a design, quantities and properties, and a wide range of details that can be checked against applicable codes, ordinances, and regulations. In various embodiments, parameter input data ingested during the project database stage 220 is supplied to the compliance checking engine (4) of the cognitive data processing stage 230 which checks the input data against relevant codes and regulations. Outputs of the checking engine (4) can also be provided to an external system.

In order to perform a code compliance check, applicable codes and regulations undergo an interpretation process where the semantic structure of each regulation is translated into object rules or parametric models, using certain formal languages, and associated with the BIM or CAD data model being examined via a compliance checking engine (4). For the rules classification step (5), this data can then be compared to the rules and models, or stated another way the rules and model can be applied to the data, and deficiencies noted. The checking engine (4) may then determine if a BIM/CAD model passes or fails a compliance check against the applicable rules.

In various embodiments, these rules are examined by the compliance checking engine (4) to determine the nature of the rules, such as objective, subjective, and dependent. Non-limiting examples of objective rules involve tabular data, dimensional standards, mathematical equations, diagrammatic data, etc., whereas non-limiting examples of subjective rules can involve qualitative data, approximate reasoning, fuzzy logic. Objective rules are examined directly since the constraints are given. Dependent rules mean that they rely on other rules to be fulfilled before they can be examined. Thus, dependent rules can be objective or subjective. In case of subjective rules, fuzzy logic and predicates, neural network, and fuzzy neural networks will be utilized to transform concept into a computable rule representation. Using neural networks and fuzzy neural networks, such as Adaptive Fuzzy Neural Network (AFNN), Fuzzy ARTMAP, A type of fuzzy neural network that uses adaptive resonance theory (ART) and fuzzy logic to perform classification tasks, Fuzzy Min-Max Neural Network (FMMNN), Fuzzy Inference Neural Network (FINN), Fuzzy Associative Memory (FAM), and Fuzzy C-Means Neural Network (FCMNN).

Accordingly, the compliance checking engine (4) and the rules classification algorithms (5) can be deployed with various neural network models, including mask R-CNN framework, fully convolution network (FCN), region of interest align (RoIAlign) using the feature pyramid network (FPN), among others.

The results of the compliance checking engine (4) can be presented in different formats. For instance, textual and graphical reports showing which part of the design is in compliance and non-compliance referencing the location of the object and the relevant provision in the code or regulations. Machine learning models are used to correlate the compliance results with the sets of data input to create a predictive model. The predictive model aims to learn to predict outputs based on inputs utilizing supervised learning models. These models may include Support Vector Machines (SVM), Recurrent Neural Networks (RNN), and Transformers.

The disclosed (AI-CCC) framework of the present disclosure can be implemented in software (e.g., firmware), hardware, or a combination thereof. In one embodiment, the system is implemented in software, as an executable program, and is executed by a special or general purpose digital computer, such as a personal computer (PC; IBM-compatible, Apple-compatible, or otherwise), workstation, minicomputer, or mainframe computer. As such, the disclosed (AI-CCC) framework, in some embodiments, comprises a source program, executable program (object code), script, or any other entity comprising a set of instructions to be performed. When a source program, then the program needs to be translated via a compiler, assembler, interpreter, or the like, which may or may not be included within the memory 140 so as to operate properly in connection with the O/S 122. Furthermore, the disclosed (AI-CCC) framework can be written as (a) an object oriented programming language, which has classes of data and methods, or (b) a procedure programming language, which has routines, subroutines, and/or functions, for example but not limited to, C, C++, C#, Objective C, Java®, JavaScript®, Perl, PHP, Visual Basic®, Python®, Ruby, Flash®, or other programming languages. In accordance with the present disclosure, the disclosed (AI-CCC) framework may reside within storage on a local device or remotely accessible across a network.

The memory 140 can include any one or combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory 140 may incorporate electronic, magnetic, optical, and/or other types of storage media. Note that the memory 140 can have a distributed architecture, where various components are situated remote from one another, but can be accessed by the processor 120.

The software in memory 140 may include one or more separate programs, each of which comprises an ordered listing of executable instructions for implementing logical functions. In the example of FIG. 2, the software in the memory 140 includes the data preprocessing 210, project database 220, cognitive data processing 230, and/or results reporting 240 stage(s) in accordance with the present disclosure, and a suitable operating system (O/S) 122. A nonexhaustive list of examples of suitable commercially available operating systems 122 is as follows: (a) a Windows operating system available from Microsoft Corporation; (b) a Macintosh operating system available from Apple Computer, Inc.; (c) a UNIX operating system, which is available for purchase from many vendors, such as the Hewlett-Packard Company, Sun Microsystems, Inc., and AT&T Corporation; (d) a LINUX operating system, which is freeware that is readily available on the Internet; or (e) an appliance-based operating system, such as that implemented in handheld computers, mobile phones, or tablets. The operating system 122 essentially controls the execution of other computer programs and provides scheduling, input-output control, file and data management, memory management, and communication control and related services.

The I/O devices 160 may include input devices, for example but not limited to, a keyboard, mouse, scanner, microphone, etc. Furthermore, the I/O devices 160 may also include output devices, for example but not limited to, a printer, display, etc. Finally, the I/O devices 160 may further include devices that communicate both inputs and outputs, for instance but not limited to, a modulator/demodulator (modem; for accessing another device, system, or network), a radio frequency (RF) or other transceiver, a telephonic interface, a bridge, a router, etc. One input device 160 of the present disclosure includes a keyboard and an electro-mechanical or optical mouse. The input device 160 can be used to input information which is acted upon by the processor 120 to control a cursor or other pointer on a computer display, such as a computer monitor 145. Other pointer mechanisms such as trackballs, electronic pens, input tablets, joystick, touch pad, arrow keyboard controls, etc. are considered to be equivalents of the mouse.

The monitor 145 is coupled to the processor 120 and includes a screen upon which an image can be displayed. Among others, the monitor 145 may be a raster-type device (such as a video monitor or a liquid-crystal display panel) having a matrix of picture elements or "pixels" which can be selectably activated to create the image.

For a conventional Design Review Process (DRP), design professionals (such as architects and engineers) and construction professionals (such as contractors) can be consulted to prepare documents related to a building permit application for a building project. Accordingly, the application can be submitted to the applicable government authority to be reviewed, revised if necessary, and approved to result in issuance of a building permit before construction can commence on the building project.

Accordingly, the appropriate government authority or department will manually review the building documents to determine if they comply with the appropriate building code sections. The building or Land Development Code documents can often be submitted as PDF (Portable Document Format) forms (e.g., the building drawings including the plans, sections, elevations, and all construction details are generated using a computer-aided design (CAD) program), but the review of the forms has not changed significantly from when hardcopies forms were submitted in prior years.

Accordingly, the manual building design review process (DRP) is time-consuming, error-prone, subjective, and is becoming very costly to sustain. Reasons behind these issues include: (a) increase rate of updates of regulations and standards with new knowledge and research outcomes; (b) new, state of the art technologies, equipment, and devices; and (c) a higher amount of data and its multidisciplinary nature (Nawari, 2012a; Nawari and Alsaffar, 2017 and 2017;). Moreover, for building designs, other issues associated with the manual DRP are lack of consistency in interpretation of regulatory provisions, the ability to properly self-check required aspects, and the long time needed for approvals of construction permits by building authorities that can have adverse financial impacts on projects submitted for authorization. Additionally, building and Land Development codes and regulations are legal documents written and authorized by people to be understood and applied by professionals. As such, building codes and regulations are not precise as formal logic. Thus, the automation of a Design Review Process (DRP) is a challenge for the construction industry.

In accordance with embodiments of the present disclosure, exemplary systems and methods for transforming civil, architectural, and engineering drawings into Building Information Modeling (BIM) or Computer-Aided Design (CAD) models and/or ensuring that models conform with compliance standards are provided to facilitate automation of the Design Review Process. Previously existing approaches for automated rules compliance verification in building design are either based on proprietary frameworks, domain-specific areas, or hard-coded rule-based expressions. While these approaches may be useful in their specific implementations, they have the disadvantages of being costly to sustain, difficult to modify, and the absence of a generalized framework of rules and regulations modeling that can adjust to different domains-thus, they are not compatible with an open data standard. Furthermore, the existing approaches do not have the means to deal with subjective and ambiguous building regulations, and they have not endured the test of industry applications.

An exemplary method for transforming civil, architectural, and engineering drawings into Building Information Modeling (BIM) or Computer-Aided Design (CAD) models can automate a compliance checking process by having applicants upload their civil, architectural, and/or engineering drawings (e.g., in a PDF format) and have them transformed in a Building Information Model (BIM; such as Autodesk Revit files or CAD (such as Autodesk DWG or DXF files) or PDF data or Industry Foundation Classes (IFC) file/data, to a platform, such as (AI-CCC) system 100, which can be configured to compare the object information contained in the transformed file to the local, state, national or international codes, ordinances and regulations. The results of the comparison, and any issue flagged can then be presented as output, e.g., to a user system.

In order to perform the comparison, the codes, ordinances and regulations must undergo an interpretation process where the semantic structure of each regulation is translated into object rules or parametric models, using certain formal languages, and associated with the building permit application file data being examined. This data can then be compared to the rules and models, or stated another way the rules and model can be applied to the data, and deficiencies noted. In a non-limiting example, the BIM model defines objects as parameters and relations to other objects and carrying object attributes that specify pertinent details about the objects. For example, the BIM data can include spatial relationships of the building design, quantities and properties of building components, and a wide range of building details including architectural, structural, Mechanical, Electrical, Plumbing & Fire (MEPF), and other engineering systems and design information that can be checked against applicable codes and regulations. Automated determination of code compliance can include a variety of regulations, such as site zoning & development, utilities, infrastructure, etc.

It should be understood that the described processes may be embodied in one or more software modules that are executed by one or more hardware processors (e.g., processor 120), for example, as the application discussed herein. The described processes may be implemented as instructions represented in source code, object code, and/or machine code. These instructions may be executed directly by hardware processor(s) 120, or alternatively, may be executed by a virtual machine operating between the object code and hardware processors 120. In addition, the disclosed application may be built upon or interfaced with one or more existing systems.

Alternatively, the described processes may be implemented as a hardware component (e.g., general-purpose processor, integrated circuit (IC), application-specific integrated circuit (ASIC), digital signal processor (DSP), field-programmable gate array (FPGA) or other programmable logic device, discrete gate or transistor logic, etc.), combination of hardware components, or combination of hardware and software components. To clearly illustrate the interchangeability of hardware and software, various illustrative components, blocks, modules, circuits, and steps are described herein generally in terms of their functionality. Whether such functionality is implemented as hardware or software depends upon the particular application and design constraints imposed on the overall system. Skilled persons can implement the described functionality in varying ways for each particular application, but such implementation decisions should not be interpreted as causing a departure from the scope of the claims included herein. In addition, the grouping of functions within a component, block, module, circuit, or step is for ease of description. Specific functions or steps can be moved from one component, block, module, circuit, or step to another.

Furthermore, while the processes, described herein, are illustrated with a certain arrangement and ordering of sub-processes, each process may be implemented with fewer, more, or different subprocesses and a different arrangement and/or ordering of subprocesses. In addition, it should be understood that any subprocess, which does not depend on the completion of another subprocess, may be executed before, after, or in parallel with that other independent subprocess, even if the subprocesses are described or illustrated in a particular order.

Certain embodiments of the present disclosure can be implemented in hardware, software, firmware, or a combination thereof. In various embodiments, such software or firmware is stored in computer-readable medium (e.g., a memory) and that is executed by a suitable instruction execution system. In various embodiments, such hardware can be implemented with any or a combination of the following technologies, which are all well known in the art: discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

In the context of this document, a "computer-readable medium" can be any means that can contain, store, communicate, or transport the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: an electrical connection (electronic) having one or more wires, a portable computer diskette or drive (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical).

AI-CCC system 100 may comprise web servers which host one or more websites and/or web services. In embodiments in which a website is provided, the website may comprise a graphical user interface, including, for example, one or more screens (e.g., webpages) generated in Hyper-Text Markup Language (HTML) or other language. In various embodiments, AI-CCC system 100 transmits or serves one or more screens of the graphical user interface in response to requests from user computing/communication system(s). In some embodiments, these screens may be served in the form of a wizard, in which case two or more screens may be served in a sequential manner, and one or more of the sequential screens may depend on an interaction of the user or user system with one or more preceding screens. The requests to AI-CCC system 100 and the responses from AI-CCC system 100, including the screens of the graphical user interface, may both be communicated through network(s), which may include the Internet, using standard communication protocols (e.g., HTTP, HTTPS, etc.). These screens (e.g., webpages) may comprise a combination of content and elements, such as text, images, videos, animations, references (e.g., hyperlinks), frames, inputs (e.g., textboxes, text areas, checkboxes, radio buttons, drop-down menus, buttons, forms, etc.), scripts (e.g., JavaScript), and the like, including elements comprising or derived from data stored in one or more databases or data stores that are locally and/or remotely accessible to AI-CCC system 100. AI-CCC system 100 may also respond to other requests from user system(s).

The above description of the disclosed embodiments is provided to enable any person skilled in the art to make or use the invention. Various modifications to these embodiments will be readily apparent to those skilled in the art, and the general principles described herein can be applied to other embodiments without departing from the spirit or scope of the present disclosure. Thus, it is to be understood that the description and drawings presented herein represent various embodiments, including a presently preferred embodiment, of the invention and are therefore representative of the subject matter which is broadly contemplated by the present disclosure. It is further understood that the scope of the present disclosure fully encompasses other embodiments that may become obvious to those skilled in the art and that the scope of the present disclosure is accordingly not limited.

What is claimed is:

1. A method comprising:
   training, using at least one hardware processor, an artificial intelligence algorithm on a collection of 2D civil and architectural blueprint designs to enable the artificial intelligence algorithm to efficiently extract elements from the blueprint designs and map them into 3D data model objects;
   creating, using the at least one hardware processor, a 3D data model using the trained artificial intelligence algorithm, from an input collection of 2D blueprint designs, wherein the input collection of 2D blueprint designs include an architectural plan, a land development site plan, and a re-zoning approval document;
   creating, using the at least one hardware processor, a project database by adding metadata from the input collection of 2D blueprint designs that includes the architectural plan, the land development site plan, and the re-zoning approval document;
   linking, using the at least one hardware processor, metadata stored in the project database to the model objects in the 3D data model;
   generating a database of code rules and regulations;
   performing, using the project database and the database of code rules and regulations, a compliance check to determine if the 3D data model complies with the database of code rules and regulations; and
   presenting, using the at least one hardware processor, results of the compliance check.

2. The method of claim 1, wherein the 3D data model comprises a Building Information Modeling 3D data model.

3. The method of claim 1, wherein the 3D data model comprises a Computer-Aided Design 3D data model.

4. The method of claim 1, wherein the artificial intelligence algorithm performs Mask R-CNN framework, Fully Convolutional Network (FCN), and/or Region of Interest Align (RoIAlign) using Feature Pyramid Network (FPN) operations.

5. The method of claim 1, wherein the results of the compliance check are presented in a graphical report showing which object of the 3D data model is in compliance or non-compliance by referencing a location of the object and a relevant provision in the code or regulations.

6. The method of claim 1, wherein the metadata from the input collection of 2D blueprint designs is compared against the database of code rules and regulations to determine if the 3D data model complies with the database of code rules and regulations.

7. The method of claim 6, wherein the database of code rules and regulations include objective, subjective, and dependent rules.

8. A system comprising:
   at least one hardware processor; and
   one or more software modules that are configured to, when executed by the at least one hardware processor:
      train an artificial intelligence algorithm on a collection of 2D civil and architectural blueprint designs to enable the artificial intelligence algorithm to efficiently extract elements from the blueprint designs and map them into 3D data model objects;
      create a 3D data model using the trained artificial intelligence algorithm, from an input collection of 2D blueprint designs, wherein the input collection of 2D blueprint designs include an architectural plan, a land development site plan, and a re-zoning approval document;
      create a project database by adding metadata from the input collection of 2D blueprint designs that includes the architectural plan, the land development site plan, and the re-zoning approval document;
      link metadata stored in the project database to the model objects in the 3D data model;

generate a database of code rules and regulations;
perform, using the project database and the database of code rules and regulations, a compliance check to determine if the 3D data model complies with the database of code rules and regulations; and
present results of the compliance check.

9. The system of claim 8, wherein the 3D data model comprises a Building Information Modeling 3D data model.

10. The system of claim 8, wherein the 3D data model comprises a Computer-Aided Design 3D data model.

11. The system of claim 10, wherein the artificial intelligence algorithm performs Mask R-CNN framework, Fully Convolutional Network (FCN), and/or Region of Interest Align (RolAlign) using Feature Pyramid Network (FPN) operations.

12. The system of claim 8, wherein the results of the compliance check are presented in a graphical report showing which object of the 3D data model is in compliance or non-compliance by referencing a location of the object and a relevant provision in the code or regulations.

13. The system of claim 8, wherein the metadata from the input collection of 2D blueprint designs is compared against the database of code rules and regulations to determine if the 3D data model complies with the database of code rules and regulations.

14. The system of claim 13, wherein the database of code rules and regulations include objective, subjective, and dependent rules.

15. A non-transitory computer-readable medium having instructions stored therein, wherein the instructions, when executed by a processor, cause the processor to:
train an artificial intelligence algorithm on a collection of 2D civil and architectural blueprint designs to enable the artificial intelligence algorithm to efficiently extract elements from the blueprint designs and map them into 3D data model objects;
create a 3D data model using the trained artificial intelligence algorithm, from an input collection of 2D blueprint designs, wherein the input collection of 2D blueprint designs include an architectural plan, a land development site plan, and a re-zoning approval document;
create a project database by adding metadata from the input collection of 2D blueprint designs that includes the architectural plan, the land development site plan, and the re-zoning approval document;
link metadata stored in the project database to the model objects in the 3D data model;
generate a database of code rules and regulations;
perform, using the project database and the database of code rules and regulations, a compliance check to determine if the 3D data model complies with the database of code rules and regulations; and
present results of the compliance check.

16. The non-transitory computer-readable medium of claim 15, wherein the 3D data model comprises a Building Information Modeling 3D data model.

17. The non-transitory computer-readable medium of claim 15, wherein the 3D data model comprises a Computer-Aided Design 3D data model.

18. The non-transitory computer-readable medium of claim 17, wherein the artificial intelligence algorithm performs Mask R-CNN framework, Fully Convolutional Network (FCN), and/or Region of Interest Align (RolAlign) using Feature Pyramid Network (FPN) operations.

19. The non-transitory computer-readable medium of claim 15, wherein the results of the compliance check are presented in a graphical report showing which object of the 3D data model is in compliance or non-compliance by referencing a location of the object and a relevant provision in the code or regulations.

20. The non-transitory computer-readable medium of claim 15, wherein the metadata from the input collection of 2D blueprint designs is compared against the database of code rules and regulations to determine if the 3D data model complies with the database of code rules and regulations.

* * * * *